United States Patent
Chou

(10) Patent No.: US 9,953,960 B2
(45) Date of Patent: Apr. 24, 2018

(54) MANUFACTURING PROCESS OF WAFER LEVEL CHIP PACKAGE STRUCTURE HAVING BLOCK STRUCTURE

(71) Applicant: ChipMOS Technologies Inc., Hsinchu (TW)

(72) Inventor: Shih-Wen Chou, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 15/484,056

(22) Filed: Apr. 10, 2017

(65) Prior Publication Data

US 2017/0221860 A1 Aug. 3, 2017

Related U.S. Application Data

(62) Division of application No. 14/855,397, filed on Sep. 16, 2015, now Pat. No. 9,653,429.

(30) Foreign Application Priority Data

Apr. 27, 2015 (TW) .............................. 104113401 A

(51) Int. Cl.
*H01L 25/065* (2006.01)
*H01L 21/56* (2006.01)
(Continued)

(52) U.S. Cl.
CPC ........ *H01L 25/0657* (2013.01); *H01L 21/563* (2013.01); *H01L 21/78* (2013.01);
(Continued)

(58) Field of Classification Search
CPC .............. H01L 25/0657; H01L 21/563; H01L 23/3142; H01L 24/09; H01L 24/11; H01L 24/17; H01L 24/81; H01L 24/94; H01L 24/97; H01L 23/00; H01L 23/03; H01L 25/162; H01L 24/49; H01L 25/50; H01L 21/78; H01L 2225/06513;
(Continued)

(56) References Cited

U.S. PATENT DOCUMENTS 5,977,640 A * 11/1999 Bertin ................. H01L 25/0657
257/686
6,704,609 B1 * 3/2004 Shen ....................... H01L 23/13
257/E21.514

(Continued)

*Primary Examiner* — Alexander Oscar Williams
(74) *Attorney, Agent, or Firm* — JCIPRNET

(57) ABSTRACT

A multi-chip package structure includes a first chip, at least one blocking structure, a plurality of first conductive bumps, a second chip, a plurality of second conductive bumps and an underfill. The first chip has a chip connecting zone, a plurality of first inner pads in the chip connecting zone and a plurality of first outer pads outside of the chip connecting zone. The blocking structure is disposed between the first inner pads and the first outer pads and surrounds the first inner pads. The first conductive bumps are disposed on the first outer pads. The second chip is flipped on the chip connecting zone and has a plurality of second pads. The second conductive bumps are disposed between the first inner pads and the second pads. The underfill is disposed between the first chip and the second chip so as to cover the second conductive bumps.

9 Claims, 7 Drawing Sheets

(51) Int. Cl.
    *H01L 21/78*           (2006.01)
    *H01L 25/00*           (2006.01)

(52) U.S. Cl.
    CPC .... *H01L 25/50* (2013.01); *H01L 2225/06513* (2013.01); *H01L 2225/06517* (2013.01); *H01L 2225/06568* (2013.01)

(58) Field of Classification Search
    CPC . H01L 2225/06568; H01L 2225/06517; H01L 28/10; H01L 23/28; H01L 25/105; H01L 27/0688; H01L 27/124; H01L 28/283; H01L 25/065; H01L 21/56; H01L 25/00
    USPC ....... 257/737, 738, 778, 777, 686, 685, 723, 257/724, 731, 733, 675, 706, 712, 784, 257/786, 797, 796
    See application file for complete search history.

(56) References Cited

U.S. PATENT DOCUMENTS

| | | | | |
|---|---|---|---|---|
| 6,921,968 B2* | 7/2005 | Chung | .................. | H01L 21/563 257/686 |
| 6,989,586 B2* | 1/2006 | Agraharam | ....... | H01L 23/49811 257/678 |
| 7,078,788 B2* | 7/2006 | Vu | .......................... | H01L 21/56 174/521 |
| 7,129,583 B2* | 10/2006 | Tao | ..................... | H01L 23/3128 257/684 |
| 9,281,300 B2* | 3/2016 | Merilo | ................... | H01L 24/49 |
| 9,653,429 B2* | 5/2017 | Chou | ................... | H01L 25/0657 |
| 2002/0027295 A1* | 3/2002 | Kikuma | .............. | H01L 23/3121 257/780 |
| 2002/0125558 A1* | 9/2002 | Akram | ................... | H05K 1/144 257/686 |
| 2002/0127771 A1* | 9/2002 | Akram | ................... | H01L 23/13 438/107 |
| 2003/0047798 A1* | 3/2003 | Halahan | .................. | H01L 23/13 257/685 |
| 2003/0141583 A1* | 7/2003 | Yang | ..................... | H01L 21/563 257/686 |
| 2003/0160316 A1* | 8/2003 | Shieh | ..................... | H01L 21/563 257/686 |
| 2004/0183179 A1* | 9/2004 | Shieh | .................. | H01L 23/3128 257/686 |
| 2004/0183181 A1* | 9/2004 | Sweterlitsch | ....... | H01L 25/0657 257/686 |
| 2004/0212067 A1* | 10/2004 | Wang | ................... | H01L 25/0657 257/686 |
| 2005/0062173 A1* | 3/2005 | Vu | .......................... | H01L 21/56 257/787 |
| 2005/0139979 A1* | 6/2005 | Tao | ..................... | H01L 23/3128 257/686 |
| 2005/0233571 A1* | 10/2005 | Tao | ....................... | H01L 21/563 438/614 |
| 2005/0242422 A1* | 11/2005 | Klein | ................... | H01L 21/563 257/686 |
| 2005/0248019 A1* | 11/2005 | Chao | ................... | H01L 25/0657 257/686 |
| 2005/0285254 A1* | 12/2005 | Buot | ................... | H01L 25/0657 257/700 |
| 2006/0220206 A1* | 10/2006 | Gerber | ............. | H01L 23/49816 257/686 |
| 2014/0160688 A1* | 6/2014 | Lu | .......................... | H05K 1/181 361/728 |

* cited by examiner

MANUFACTURING PROCESS OF WAFER LEVEL CHIP PACKAGE STRUCTURE HAVING BLOCK STRUCTURE

CROSS-REFERENCE TO RELATED APPLICATION

This application is a divisional application of and claims the priority benefit of a prior application Ser. No. 14/855,397, filed on Sep. 16, 2015, now U.S. Pat. No. 9,653,429. The prior application Ser. No. 14/855,397 claims the priority benefit of Taiwan application serial no. 104113401, filed on Apr. 27, 2015. The entirety of each of the above-mentioned patent applications is hereby incorporated by reference herein and made a part of this specification.

BACKGROUND OF THE INVENTION

1. Field of the Invention

The invention generally relates to a package structure and a manufacturing process, and more particularly, to a multi-chip package structure, a wafer level chip package structure and a manufacturing process thereof.

2. Description of Related Art

The integrated circuit chips (IC chips) are required to more offer powerful functions as electronic products develop toward high functionality, high-speed signal transmission and high density of circuit elements. Moreover, more passive devices are demanded for consumer electronic products. However, under the developing trends of electronic products for miniaturization, lightweight, and low cost, the IC packaging industry is concerned about how to accommodate numerous electronic components or devices in the limited packaging space. In order to meet the above requests, packaging technology gradually moves towards a system integration phase of system in package (SIP), and more particularly to the packaging of multi-chip module (MCM).

Using a multi-chip package structure an example, it is mainly to dispose a first chip on a second chip by a face-to-face method, and then to use a conductive bump as an electrically connection media between the chips, wherein the second chip will be electrically connected with a circuit board by means of using a bump or wire bonding.

In such package structure, since the space on the chips increasingly narrows, when a size of the first chip is close to that of the second chip, an edge of the first chip will be very close to the conductive bump, which is configured to connect to the circuit board, on the second chip. Therefore, when filling an underfill in-between the first chip and the second chip, the underfill can easily overflow to a solder pad of the conductive bump, which is configured to connect to the circuit board, on the second chip, and thereby influence the electrical connection reliability between the second chip and the circuit board.

SUMMARY OF THE INVENTION

The invention is directed to a multi-chip package structure having a blocking structure capable of preventing an underfill overflow.

The invention is directed to a wafer level chip package structure, which can cut out a plurality of said multi-chip package structures.

The invention is directed to a wafer level chip package manufacturing process structure, which is capable of producing said wafer level chip package structure.

A multi-chip package structure of the invention includes a first chip, at least one blocking structure, a plurality of first conductive bumps, a second chip, a plurality of second conductive bumps, and an underfill. The first chip has a chip connecting zone, a plurality of first inner pads locate in the chip connecting zone and a plurality of first outer pads located outside of the chip connecting zone. The blocking structure is disposed on a region outside of the chip connecting zone of the first chip and between the first inner pads and the first outer pads to surround the first inner pads. The first conductive bumps are disposed on the first outer pads. The second chip is flipped on the chip connecting zone, and the second chip has a plurality of second pads. The second conductive bumps are located between the first inner pads and the second pads, and each of the first inner pads is electrically connected with the corresponding second pad through the corresponding second conductive bump. The underfill is located between the first chip and the second chip so as to cover the second conductive bumps.

A wafer level chip package manufacturing process of the invention includes the following steps. A wafer including a plurality of first chips arranged in an array and a plurality of blocking structures corresponded to the first chips is provided, wherein each of the first chips has a chip connecting zone, a plurality of first inner pads located in the chip connecting zone and a plurality of first outer pads located outside the chip connecting zone, wherein each of the blocking structures is disposed on a region outside of the chip connecting zone of the corresponding first chip and between the first inner pads and the first outer pads to surround the first inner pads. A plurality of first conductive bumps is formed on the first outer pads. A plurality of second chips is provided, each of the second chips has a plurality of second pads, and the second pads are formed with a plurality of second conductive bumps thereon. The second chips are flipped on the chip connecting zones, so that the second conductive bumps are located between the first inner pads and the second pads, and each of the first inner pads is electrically connected with the corresponding second pad through the corresponding second conductive bump. An underfill is formed between the first chips and the second chips so as to cover the second conductive bumps.

A wafer level chip package structure of the invention includes a wafer, a plurality of first conductive bumps, a plurality of second chips, a plurality of second conductive bumps, and an underfill. The wafer includes a plurality of first chips arranged in an array and a plurality of blocking structures corresponded to the first chips. Each of the first chips has a chip connecting zone, a plurality of first inner pads located in the chip connecting zone and a plurality of first outer pads located outside of the chip connecting zone, wherein each of the blocking structures is disposed on a region outside of the chip connecting zone of the corresponding first chip and between the first inner pads and the first outer pads to surround the first inner pads. The first conductive bumps are disposed on the first outer pads. The second chips are flipped on the chip connecting zones, and each of the second chips has a plurality of second pads. The second conductive bumps are located between the first inner pads and the second pads, and each of the first inner pads is electrically connected with the corresponding second pad through the corresponding second conductive bump. The underfill is located between the first chips and the second chips, so as to cover the second conductive bumps.

In view of the foregoing, the multi-chip package structure of the invention blocks the underfill between the first chip and the second chip from flowing to the first conductive bumps by disposing the blocking structure on the region outside of the chip connecting zone of the first chip and between the first inner pads and the first outer pads to surround the first inner pads, and thus avoids influencing an electrical connectivity between the first conductive bumps and the circuit board. The invention may further provide the wafer level chip package structure, which can cut out a plurality of said multi-chip package structures, and the manufacturing process thereof.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
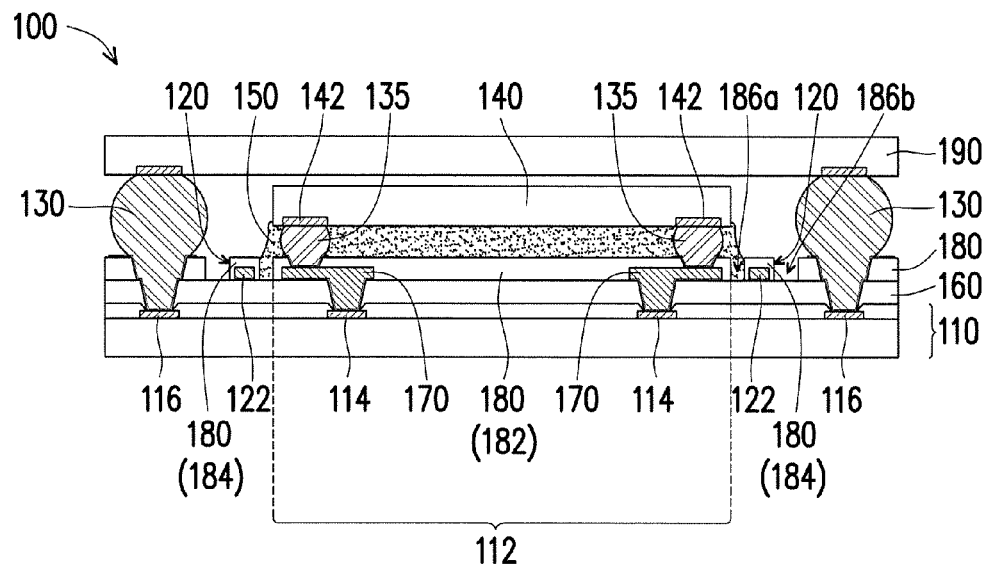
FIG. 1 is a schematic view illustrating a multi-chip package structure according to an embodiment of the invention.

FIG. 1 is a schematic view illustrating a multi-chip package structure according to an embodiment of the invention. Referring to FIG. 1, a multi-chip package structure 100 of the present embodiment includes a first chip 110, at least one blocking structure 120, a plurality of first conductive bumps 130, a plurality of second conductive bumps 135, a second chip 140, an underfill 150, a first insulating layer 160, a redistribution circuit layer 170, a second insulating layer 180, and a circuit board 190.

The first chip 110 has a chip connecting zone 112, a plurality of first inner pads 114 located in the chip connecting zone 112 and a plurality of first outer pads 116 located outside of the chip connecting zone 112. The first insulating layer 160 is disposed on the first chip 110 and exposes the first inner pads 114 and the first outer pads 116. The redistribution circuit layer 170 is disposed on the first insulating layer 160 and electrically connected with the first inner pads 114. The second insulating layer 180 covers on the first insulating layer 160 and the redistribution circuit layer 170, so as to expose a portion of the redistribution circuit layer 170 and the first outer pads 116.

In the present embodiment, a size of the first chip 110 is greater than a size of the second chip 140, and the second chip 140 of smaller size is flipped on the chip connecting zone 112 of the first chip 110 of larger size. The second chip 140 has a plurality of second pads 142. The second conductive bumps 135 are located between the first inner pads 114 of the first chip 110 and the second pads 142 of the second chip 140. The first inner pads 114 of the first chip 110 are electrically connected with the corresponding second pads 142 on the second chip 140 through the redistribution circuit layer 170 and the corresponding second conductive bumps 135, so that the first chip 110 is electrically connected with the second chip 140.

The underfill 150 is located between the first chip 110 and the second chip 140, so as to cover the second conductive bumps 135. A material of the underfill 150 is, for example, epoxy and so forth, and the underfill 150 can be used to provide fixing and sealing effects between the first chip 110 and the second chip 140, and can further provide cushion, moisture-proof and dust-proof effects for enhancing a reliability of the multi-chip package structure 100.

The first conductive bumps 130 are disposed on the first outer pads 116 of the first chip 110, and the first chip 110 can be electrically connected with a circuit board 190 through the first conductive bumps 130. In the present embodiment, since the second chip 140 and the second conductive bumps 135 are located between the circuit board 190 and the first chip 110, a height of the first conductive bumps 130 is greater than a height of the second conductive bumps 135. Furthermore, the height of the first conductive bumps 130 is greater than a total height of the second conductive bumps 135 and the second chip 140.

When manufacturing the multi-chip package structure 100 of the present embodiment, the second chip 140 is firstly being flipped on and electrically connected with the first chip 110, the underfill 150 is next being filled in-between the first chip 110 and the second chip 140, and the first chip 110 is then connected to the circuit board 190 through the first conductive bumps 130, so as to enable the first chip 110, the second chip 140 and circuit board 190 to be electrically connected with each other. As shown in FIG. 1, since the size of the first chip 110 is close to the size of the second chip 140, when the underfill 150 is filled into a portion between the first chip 110 and the second chip 140, there is a possibility that the underfill 150 may overflow to contact the first conductive bumps 130.

In order to prevent the first conductive bumps 130 from being conglutinated by the underfill 150 and later influencing a connectivity with the circuit board 190, in the present embodiment, the blocking structure 120 is disposed on a region outside of the chip connecting zone 112 of the first chip 110, and the location of the blocking structure 120 is corresponded to a position between the first inner pads 114 and the first outer pads 116. In further detail, the blocking structure 120 is disposed on the first insulating layer 160 and at a position between the first conductive bumps 130 and the second conductive bumps 135.

In the present embodiment, the second insulating layer 180 includes a first portion 182 at the center and the second portion 184 surrounding the first portion 182, and the first portion 182 of the second insulating layer 180 covers on the redistribution circuit layer 170 and exposes a portion of the redistribution circuit layer 170. The first portion 182 and the second portion 184 maintain a gap 186a therebetween; and a second gap 186b is existed between the first conductive bump 130 and the blocking structure 120. The blocking structure 120 is located between two gaps 186a and 186b, so as to form an independent protruding structure.

The blocking structure 120 includes a metal layer 122, and the second portion 184 of the second insulating layer 180 covers the metal layer 122. That is, in the present embodiment, the metal layer 122 and the second portion 184 of the second insulating layer 180 together form the blocking structure 120; and since the second portion 184 of the second insulating layer 180 covers a layer of the metal layer 122, it can function as a reinforcing structure of the blocking structure 120. Certainly, in other embodiment, the blocking structure 120 may also achieve the same blocking effect by only be formed with the second portion 184 of the second insulating layer 180 without requiring an additional metal layer 122; and the material, the shape and the style of the blocking structure 120 are not limited to the above descriptions.

Figure 2:
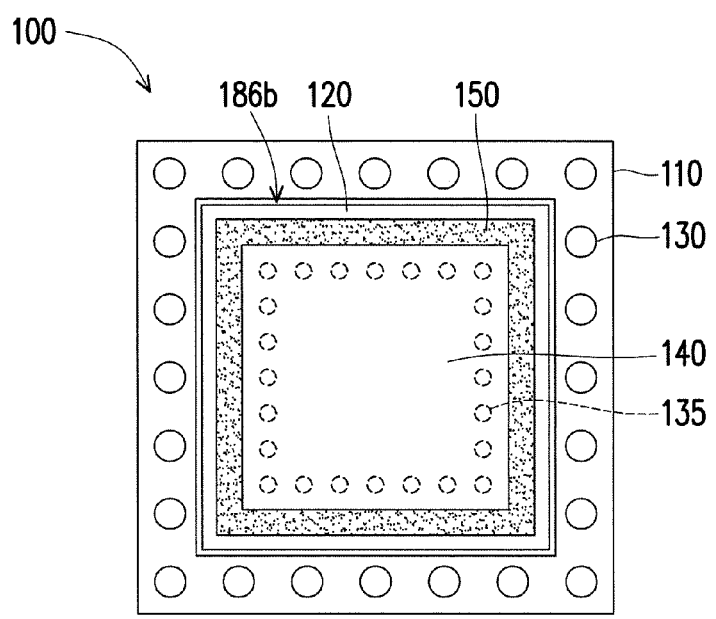
FIG. 2 is a top schematic view illustrating a circuit board that hides the multi-chip package structure of FIG. 1.

FIG. 2 is a top schematic view illustrating a circuit board that hides the multi-chip package structure of FIG. 1. As shown in FIG. 1 and FIG. 2, the blocking structure 120 is located between the first conductive bumps 130 and the second conductive bumps 135; and when the underfill 150 is filled in-between the first chip 110 and the second chip 140 to cover the second conductive bumps 135, the underfill 150 will fill up the gap 186a, and the blocking structure 120 will protrude from the first insulating layer 160 to form a steric obstacle. In other words, the blocking structure 120 will surround the underfill 150, and thereby effectively prevents the chance for the underfill 150 to overflow towards the first conductive bumps 130. Therefore, the first conductive bumps 130 will not be contaminated by the underfill 150, thereby influencing the connectivity with the circuit board 190 thereof. In the present embodiment, the first conductive bump 130 and the blocking structure 120 further have the second gap 186b existed therebetween as a second line of protection, and thus even if the underfill 150 is too much and causes some of the underfill 150 unable to be blocked by the blocking structure 120, this excess portion of the underfill 150 may still be filled into the second gap 186b at the outer side, and thus avoids contaminating the first conductive bumps 130.

It is to be explained that, in the present embodiment, the blocking structure 120 is a continuous annular protruding structure, but in other embodiment, the blocking structure 120 may also be a plurality of discrete protruding structures disposed between the first conductive bumps 130 and the second conductive bumps 135. A height of the protrusion in the drawing is illustrated as the same as a height of the first portion 182, and in the implementation, the height of the protrusion may also be slightly higher than the height of the first portion 182, and the actual shape and height of the blocking structure 120 are not being limited as long as the chance for the underfill 150 to overflow towards the first conductive bumps 130 is reduced.

Figure 3:
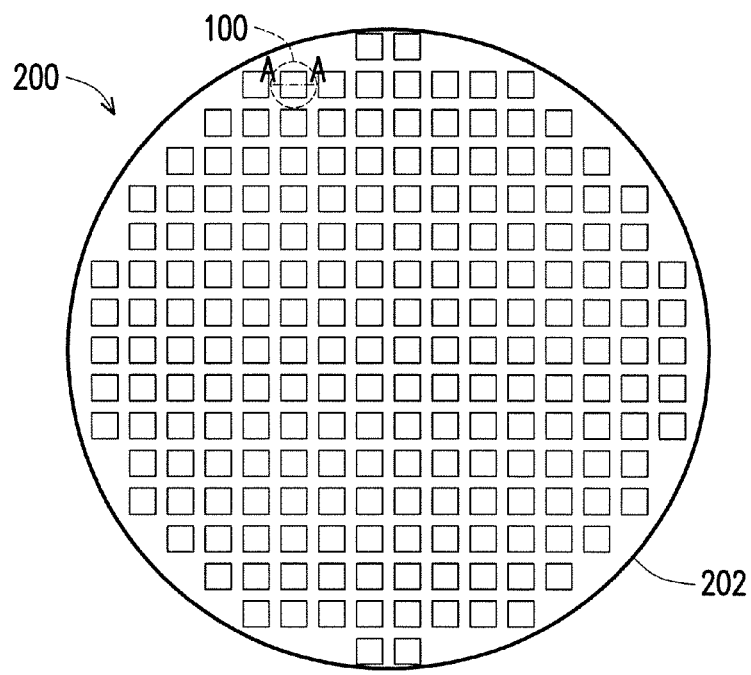
FIG. 3 is a schematic view illustrating a wafer level chip package structure according to an embodiment of the invention.

In the above embodiment, the blocking structure 120 is implemented in a Chip on Chip (COC) packaging stage, but in the other embodiment, the blocking structure 120 may also be fabricated in a Chip on Wafer (COW) packaging stage. FIG. 3 is a schematic view illustrating a wafer level chip package structure according to an embodiment of the invention. Referring to FIG. 3, before a wafer 202 is cut, the blocking structures 120, the first conductive bumps 130, the second conductive bumps 135, the second chips 140, the circuit board 160 and so forth are being disposed on the wafer 202 to form a wafer level chip package structure 200. The wafer level chip package structure 200 may be cut into a plurality of multi-chip package structures 100.

In below, using the wafer level chip package structure 200 of FIG. 3 as an example, a wafer level chip package manufacturing process of the wafer level chip package structure 200 will be explained. FIG. 4 to FIG. 12 are partial cross-sectional views schematically illustrating the manufacturing of the wafer level chip package structure according to an embodiment of the invention. FIG. 13 is a flow chart illustrating a wafer level chip package manufacturing process according to an embodiment of the invention. It is to be explained that, in order to clearly show the details regarding each element. FIG. 4 to FIG. 12 only illustrate partial regions of the wafer level chip package structure 200 during the manufacturing process. More precisely, FIG. 4 to FIG. 12 only illustrates the manufacturing process of one multi-chip package structure 100 in the wafer level chip package structure 200. Moreover, in order to facilitate understanding, an angle of perspective shown in FIG. 4 to FIG. 12 is illustrated with respect to the cross-sectional line A-A shown in FIG. 3. In addition, in the present embodiment, similar or identical elements are represented by same reference numerals as that of the elements in the previous embodiments.

A wafer level chip package manufacturing process 300 of the present embodiment includes the following steps: firstly, as depicted in step 310 of FIG. 13 and in FIG. 4 to FIG. 12, a wafer 202 is provided, and the wafer 202 includes a plurality of first chips 110 arranged in an array and a plurality of blocking structures 120 corresponded to the first chips 110, wherein each of the first chips 110 has a chip connecting zone 112, a plurality of first inner pads 114 located in the chip connecting zone 112 and a plurality of first outer pads 116 located outside of the chip connecting zone 112, and wherein each of the blocking structures 120 is disposed on a region outside of the chip connecting zone 112 of the corresponding first chip 110 and between the first inner pads 114 and the first outer pads 116 to surround the first inner pads 114.

Figure 4:
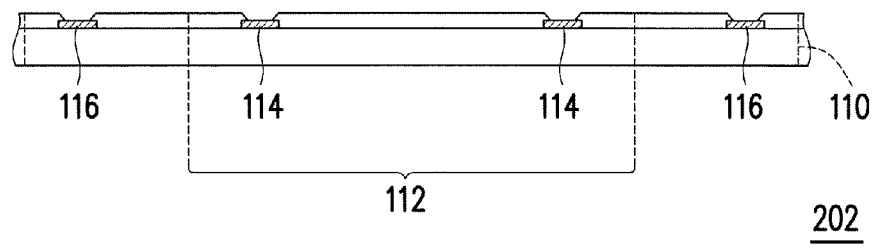
FIG. 4 to FIG. 12 are partial cross-sectional views schematically illustrating the manufacturing of the wafer level chip package structure according to an embodiment of the invention.

In detail, referring to FIG. 4, the wafer 202 includes a plurality of first chips 110, and each first chip 110 has a chip connecting zone 112, a plurality of first inner pads 114 located in the chip connecting zone 112 and a plurality of first outer pads 116 located outside of the chip connecting zone 112. In the beginning, an incoming clean step may selectively be performed on the wafer 202, so as to remove dirt on a surface of the first chip 110 through using, for example, a high pressure water jet cleaning method. Certainly, in other embodiment, the wafer 202 may also selectively not being cleaned.

Figure 5:
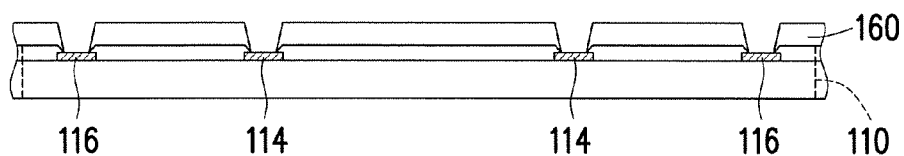

Next, as shown in FIG. 5, a first insulating layer 160 is formed on the first chip 110 by patterning. In detail, an insulating layer may firstly be coated on the first chip 110, wherein a material of the insulating layer may be a typical light-sensitive photoresist material, a polyimide (PI) layer or silicon nitride (Si3N4); then a mask (not shown) may be covered on the insulating layer; and an exposure procedure may be performed, wherein a pattern of the mask is corresponded to the pattern of the first chip that is to be exposed. Afterwards, a development procedure is performed by using a developer to dissolve and remove the unexposed insulating layer. Next, the unremoved insulating layer is cured by heating, and the cured insulating layer is performed with a surface treatment, for example, by means of oxygen plasma treatment, and thus the first insulating layer 160 is completed. As show in FIG. 5, the first insulating layer 160 is disposed on the first chip 110 and exposes the first inner pads 114 and the first outer pads 116.

Figure 6:
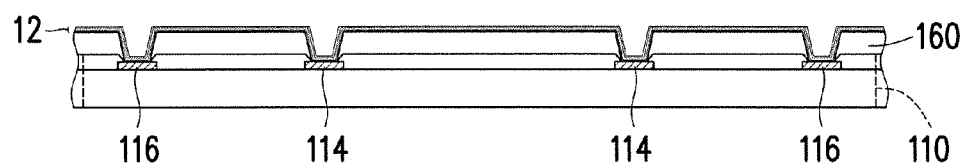

Furthermore, as shown in FIG. 6, a dielectric metal layer 12 is disposed using an UBM Deposition. In the present embodiment, firstly, argon gas is being used to remove oxides on the first insulating layer 160, the first inner pads 114 and the first outer pads 116. Next, a titanium-tungsten layer, a gold layer and a titanium layer are sequentially sputtered on the first insulating layer 160, the first inner pads 114 and the first outer pads 116 to form the dielectric metal layer 12.

Figure 7:
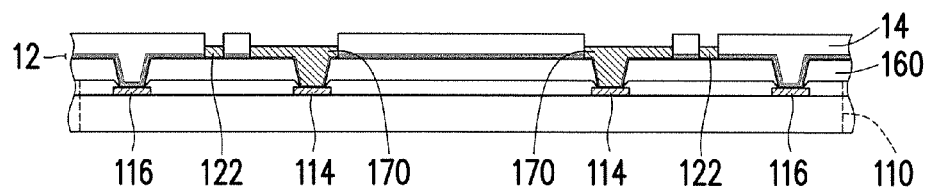
Figure 8:
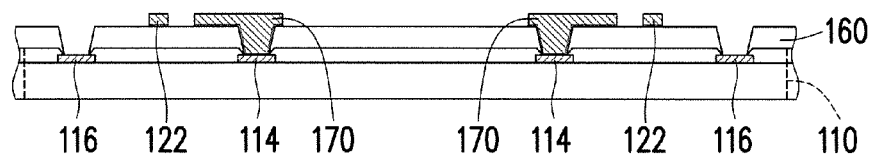

Then, as shown in FIG. 7 and FIG. 8, a photoresist layer 14, a redistribution circuit layer 170 and a metal layer 122 are formed by patterning. In detail, in the present embodiment, a photoresist material is firstly coated on the dielectric metal layer 12 of FIG. 6, and then an exposure procedure is performed. After an opening is formed at a region, corresponded to the first inner pads 114 and the first outer pads 116, on the photoresist layer 14, an electroplating procedure is performed, and the redistribution circuit layer 170 and the metal layer 122 are formed in the exposed opening. Next, the photoresist layer 14 and the dielectric metal layer 12 not covered by the redistribution circuit layer 170 and the metal layer 122 are removed, thereby remaining the redistribution circuit layer 170 and the metal layer 122. As shown in FIG. 8, the redistribution circuit layer 170 is disposed on the first insulating layer 160 and electrically connected with the first inner pads 114.

Figure 9:
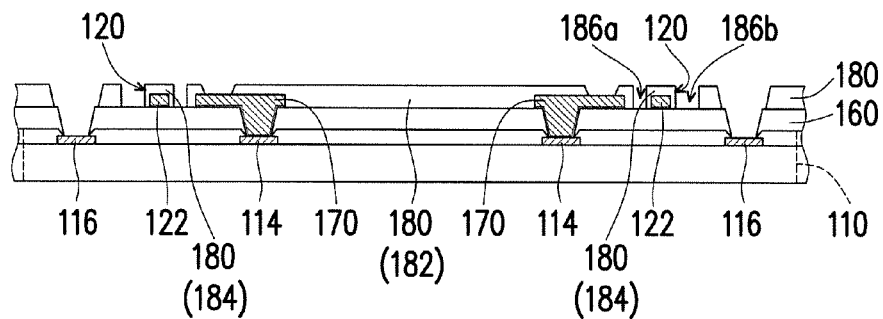

Thereafter, as shown in FIG. 9, a second insulating layer 180 is formed by patterning. In the present embodiment, a material of the second insulating layer 180 is, for example, polyimide; and as similar to the formation of the first insulating layer 160, the second insulating layer 180 is formed by the steps of exposure and development, etc. The second insulating layer 180 covers on the first insulating layer 160 and the redistribution circuit layer 170 and exposes a portion of the redistribution circuit layer 170 and the first outer pads 116. In the present embodiment, the second insulating layer 180 includes a first portion 182 and a second portion 184, and the first portion 182 and the second portion 184 maintains a gap 186a therebetween. In another embodiment, a second gap 186b may further be formed between the first conductive bump 130 and the blocking structure 120, so that the blocking structure 120 is located between two gaps 186a and 186b, so as to form an independent protruding structure. The method for forming the gaps 186a and 186b include yellow light process, laser processing or reactive ion etching (RIE). The first portion 182 covers on the redistribution circuit layer 170 and exposes a portion of the redistribution circuit layer 170, and the second portion 184 covers a single metal layer 122 and thereby forms the blocking structure 120 together with the metal layer 122. Noteworthily, if it is required to further increase the height of the blocking structure 120, then a layer made of the same material as the second insulating layer 180 may further be coated on the second portion 182 to increase the height of the blocking structure 120. In the present embodiment, step 310 is completed by the procedures shown in FIG. 4 to FIG. 9.

Figure 10:
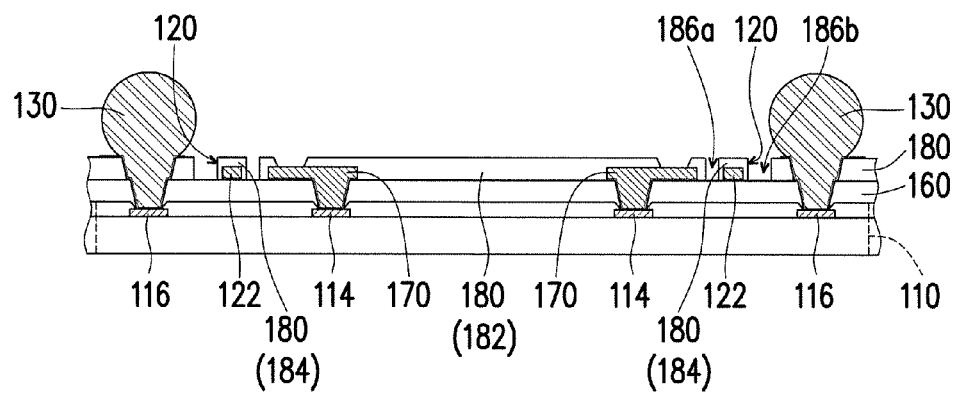

Furthermore, as shown in FIG. 10, a plurality of first conductive bumps 130 is formed on the first outer pads 116 (step 320) by means of bumping, electroplating, printing, etc, and afterwards, with heating reflow.

Figure 11:
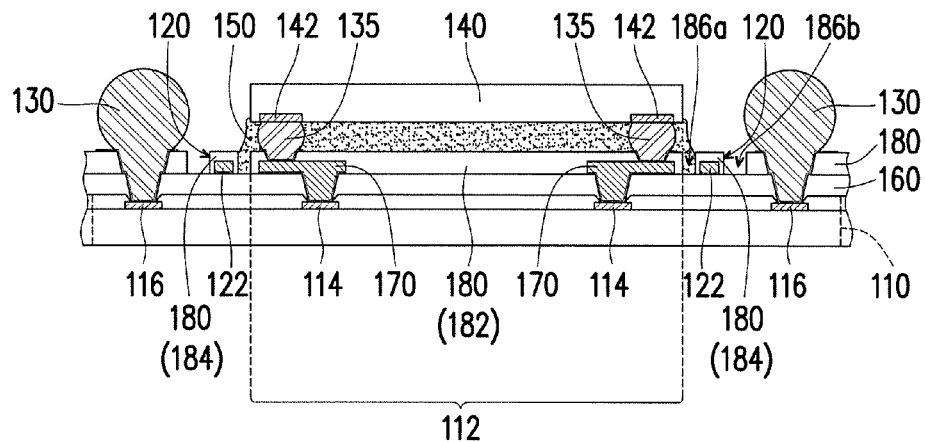

Next, as shown in FIG. 11, a second chip 140 is provided, the second chip 140 has a plurality of second pads 142, and a plurality of second conductive bumps 135 is formed on the second pads 142 (step 330). The material of the first conductive bumps 130 and the second conductive bumps 135 includes a metal element or an alloy, which may be a lead containing material (e.g., lead or tin-lead alloy) or a lead-free material, which includes gold, silver, copper, tin, nickel or an alloy thereof; in the present embodiment, the external shape of the first conductive bumps 130 and the second conductive bumps 135 is, for example, spherical; however, not only that the external shape can be spherical, cylindrical or dome-cylindrical, the material being used may also be formed by electroplating a single type of metal material or two types or more than two types of metal materials, such as to form a layer of tin (solder cap) on a copper pillar or to cover a layer of gold on the outer-wall of a copper bump and so forth, and the resulting bumps can all be feasible for the conductive bumps of the invention.

Moreover, the second chip 140 is being flipped on the chip connecting zone 112, so as to enable the second conductive bumps 135 to be located between the first inner pads 114 and the second pads 142, and to enable each of the first inner pads 114 to be electrically connected with the corresponding second pad 142 through the corresponding second conductive bump 135 (step 340), wherein the second conductive bumps 135 are electrically connected with the first inner pads 114 through the redistribution circuit layer 170. Next, an underfill 150 is formed between the first chip 110 and the second chip 140, so as to cover the second conductive bumps 135 (step 350). As shown in FIG. 11, in the present embodiment, the underfill 150 will flow out to fill the gap 186a and be blocked by the blocking structure 120. Therefore, the first conductive bumps 130 will not be contaminated by the underfill 150, and thereby, influencing the connectivity with the circuit board 190 thereof. In the present embodiment, of the first conductive bump 130 and the blocking structure 120 further have a second gap 186b existed therebetween as a second line of protection, and thus even if the underfill 150 is too much and causes some of the underfill 150 unable to be blocked by the blocking structure 120, this excess portion of the underfill 150 may still be filled into the second gap 186b at the outer side, and thus avoids contaminating the first conductive bumps 130.

Figure 12:
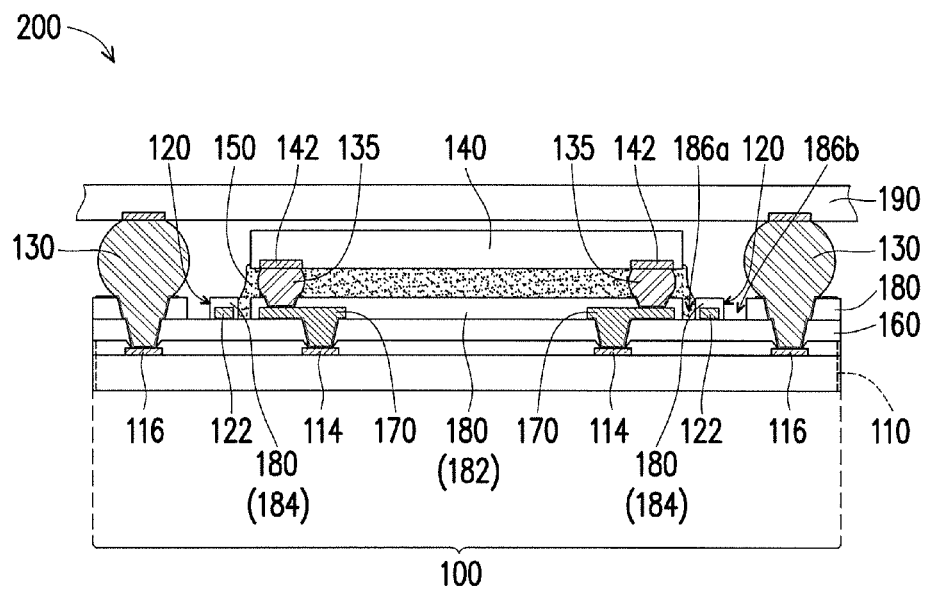
Figure 13:
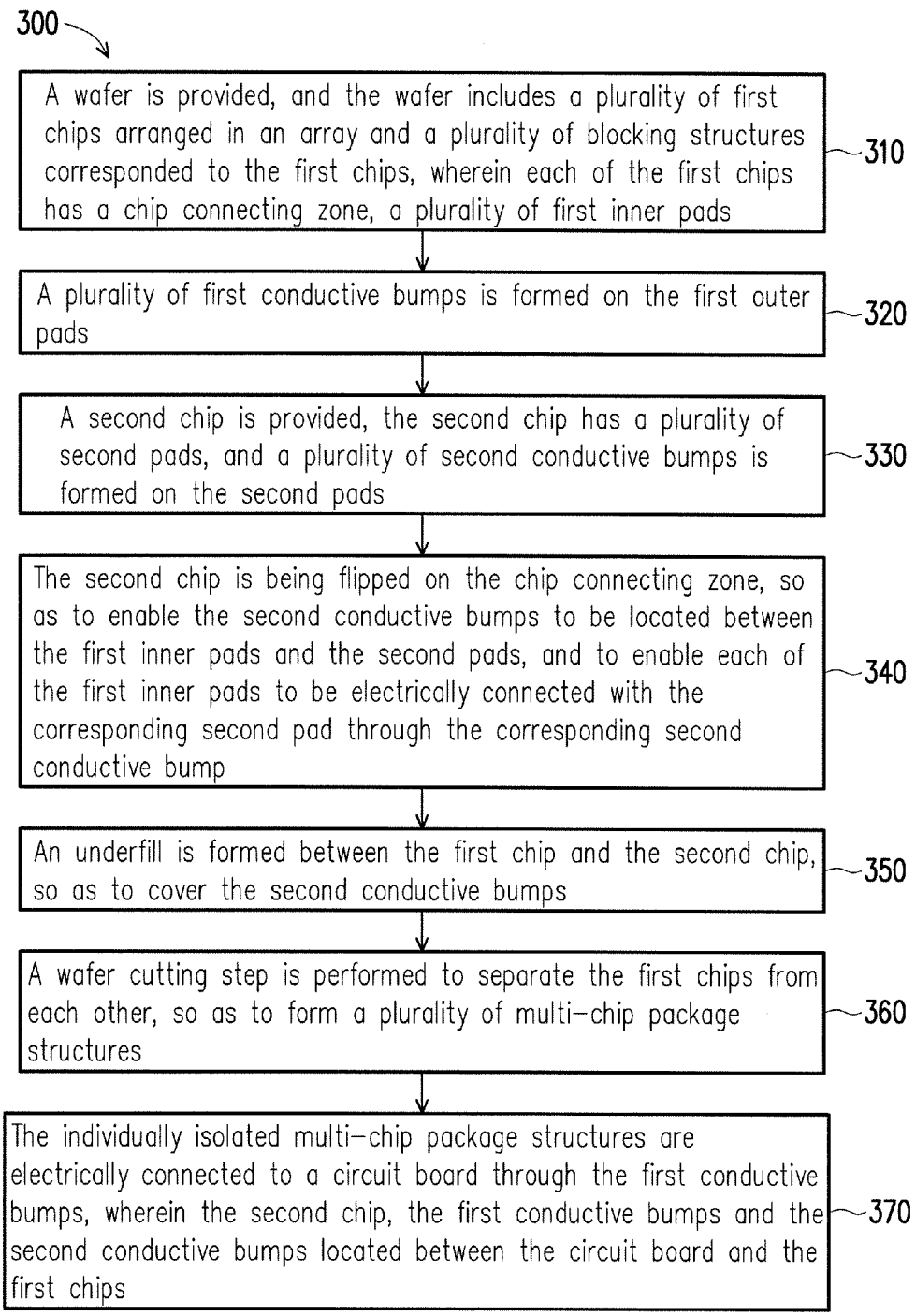
FIG. 13 is a flow chart illustrating a wafer level chip package manufacturing process according to an embodiment of the invention.

Finally, as shown in FIG. 12, a wafer cutting step is performed to separate the first chips 110 from each other, so as to form a plurality of multi-chip package structure 100s (step 360); and then, the individually isolated multi-chip package structures are electrically connected to a circuit board 190 through the first conductive bumps 130, wherein the second chip 140, the first conductive bumps 130 and the second conductive bumps 135 located between the circuit board 190 and the first chips 110 (step 370). In the step 340 and the step 370 of the present embodiment, the second conductive bumps 135 may be connected to the redistribution circuit layer 170 and the first conductive bumps 130 may be connected to the circuit board 190 through using a heating and temperature raising procedure, such as a reflow operation. Noteworthily, the reflow operation may heat the first conductive bumps 130 and the second conductive bumps 135 by reflow at the same time, or may also firstly connect the second conductive bumps 135 onto the first chip 110 by reflow and then perform a second reflow operation to connect the first conductive bumps 130 onto the circuit board 160; in terms of implementation, the reflow operation may be adjusted according to different manufacturing processes.

It is to be explained again that, FIG. 4 to FIG. 12 only illustrate a portion of the wafer level chip package structure 200; and therefore, only one multi-chip package structure 100 is shown in FIG. 12, but indeed, if viewing from the perspective of FIG. 3, then a plurality of multi-chip package structures 100 as shown in FIG. 12 may be cut out.

In addition, although, in the present embodiment, the second chip 140 is flipped on the chip connecting zone 112 (steps 330 and 340) after firstly forming the first conductive bumps 130 on the first outer pads 116 (step 320), in other embodiments, the second chip 140 may also be firstly flipped on the chip connecting zone 112 to enable the second conductive bumps 135 to connected to the first inner pads 114 (step 330、340) before forming the first conductive bumps 130 on the first outer pads 116 (step 320), such that the order of steps in the manufacturing process may be adjusted according to the practical needs.

In summary, the multi-chip package structure and the wafer level chip package structure of the invention block the underfill between the first chip and the second chip from flowing to the first conductive bumps by disposing the blocking structure on the first chip and at a position between the first inner pads and the first outer pads and surrounding the first inner pads, and thus avoid influencing the electrical connectivity between the first conductive bumps and the circuit board. The invention further provides the manufacturing process of said wafer level chip package structure, so as to produce a wafer level chip package structure that is capable of preventing the underfill from flowing to the first conductive bumps. Moreover, a plurality of said multi-chip package structures can be formed by performing a wafer cutting procedure on this wafer level chip package structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level chip package manufacturing process, comprising:
   providing a wafer, the wafer comprising a plurality of first chips arranged in an array a plurality of blocking structures corresponded to the first chips, a first insulating layer, a redistribution circuit layer, and a second insulating layer, wherein each of the first chips has a chip connecting zone, a plurality of first inner pads located in the chip connecting zone and a plurality of first outer pads located outside the chip connecting zone, each of the blocking structures is disposed on a region outside of the chip connecting zone of the corresponding first chip and between the first inner pads and the first outer pads to surround the first inner pads, the first insulating layer is disposed on the first chips and exposes the first inner pads and the first outer pads, the redistribution circuit layer is disposed on the first insulating layer and is electrically connected with the first inner pads, the second insulating layer is covered on the first insulating layer and the redistribution circuit layer to expose a portion of the redistribution circuit layer and the first outer pads;
   forming a plurality of first conductive bumps on the first outer pads;
   providing a plurality of second chips, each of the second chips having a plurality of second pads, and the second pads being formed with a plurality of second conductive bumps thereon, wherein the second conductive bumps are electrically connected with the first inner pads through the redistribution circuit layer;
   flipping the second chips on the chip connecting zones, so that the second conductive bumps are located between the first inner pads and the second pads, and each of the first inner pads is electrically connected with the corresponding second pad through the corresponding second conductive bump; and
   forming an underfill between the first chip and the second chips, so as to cover the second conductive bumps.

2. The wafer level chip package manufacturing process as recited in claim 1, a size of each of the first chips is greater than a size of each of the second chips.

3. The wafer level chip package manufacturing process as recited in claim 1, wherein before flipping the second chips on the chip connecting zones, forming the first conductive bumps on the first outer pads.

4. The wafer level chip package manufacturing process as recited in claim 1, wherein after forming the first conductive bumps on the first outer pads, flipping the second chips on the chip connecting zones.

5. The wafer level chip package manufacturing process as recited in claim 1, further comprising:
   electrically connecting the first conductive bumps to a circuit board, wherein the second chips, the first conductive bumps and the second conductive bumps are located between the circuit board and the first chips.

6. The wafer level chip package manufacturing process as recited in claim 1, wherein the second insulating layer includes a first portion and a second portion, the first portion covers the redistribution circuit layer and exposes a portion of the redistribution circuit layer, the second portion is at least a part of one of the blocking structures, and the first portion and the second portion maintain a gap therebetween.

7. The wafer level chip package manufacturing process as recited in claim 1, wherein a height each of the first conductive bumps is greater than a height of each of the second conductive bumps.

8. The wafer level chip package manufacturing process as recited in claim 1, further comprising performing a reflow operation to electrically connect the second chips with the first inner pads through the second conductive bumps.

9. The wafer level chip package manufacturing process as recited in claim 1, further comprising performing a wafer cutting step, so as to separate the first chips from each other to form a plurality of multi-chip package structures.

* * * * *